(12) United States Patent
Blasco et al.

(10) Patent No.: US 9,085,823 B2
(45) Date of Patent: Jul. 21, 2015

(54) METHOD OF FORMING A TANTALUM-CONTAINING LAYER ON A SUBSTRATE

(75) Inventors: Nicolas Blasco, Grenoble (FR); Anthony Correia-Anacleto, Maisons-Alfort (FR); Audrey Pinchart, Antony (FR); Andreas Zauner, Voisins le Bretonneux (FR); Ziyun Wang, Newark, DE (US)

(73) Assignee: L'Air Liquide, Société Anonyme pour l'Etude et l'Exploitation des Procédés Georges Claude, Paris (FR)

( * ) Notice: Subject to any disclaimer, the term of this patent is extended or adjusted under 35 U.S.C. 154(b) by 0 days.

(21) Appl. No.: 13/056,934
(22) PCT Filed: Jul. 15, 2009
(86) PCT No.: PCT/EP2009/059067
§ 371 (c)(1), (2), (4) Date: May 4, 2011
(87) PCT Pub. No.: WO2010/012595
PCT Pub. Date: Feb. 4, 2010

(65) Prior Publication Data
US 2011/0244681 A1 Oct. 6, 2011

(30) Foreign Application Priority Data
Aug. 1, 2008 (EP) .................................. 08305444

(51) Int. Cl.
*H01L 21/3205* (2006.01)
*C23C 16/455* (2006.01)
*C23C 16/18* (2006.01)

(52) U.S. Cl.
CPC ........... *C23C 16/45553* (2013.01); *C23C 16/18* (2013.01)

(58) Field of Classification Search
None
See application file for complete search history.

(56) References Cited

U.S. PATENT DOCUMENTS 6,268,288 B1 7/2001 Hautala et al.
6,368,398 B2 4/2002 Vaartstra (Continued)

FOREIGN PATENT DOCUMENTS

EP 0 708 281 4/1996
EP 2 065 390 6/2009

(Continued)

OTHER PUBLICATIONS

Schuisky, Chem. Vapor Dep. V6, 2000, p. 139.*

(Continued)

*Primary Examiner* — Joseph Miller, Jr.
(74) *Attorney, Agent, or Firm* — Patricia E. McQueeney

(57) ABSTRACT

A method for forming a tantalum-containing layer on a substrate, the method comprising at least the steps of:
a) providing a vapor comprising at least one precursor compound of the formula $Cp(R^1)_m Ta(NR^2_2)_2(=NR^3)$ (I):

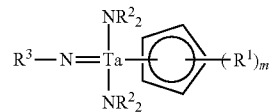

$m < 5$ wherein:
$R^1$ is an organic ligand, each one independently selected in the group consisting of H, linear or branched hydrocarbyl radical comprising from 1 to 6 carbon atoms;
$R^2$ is an organic ligand, each one independently selected in the group consisting of H, linear or branched hydrocarbyl radical comprising from 1 to 6 carbon atoms;
$R^3$ is an organic ligand selected in the group consisting of H, linear or branched hydrocarbyl radical comprising from 1 to 6 carbon atoms;
b) reacting the vapor comprising the at least one compound of formula (I) with the substrate, according to an atomic layer deposition process, to form a layer of a tantalum-containing complex on at least one surface of said substrate.

16 Claims, 1 Drawing Sheet

(56) References Cited

U.S. PATENT DOCUMENTS

| | | | |
|---|---|---|---|
| 6,379,748 | B1 | 4/2002 | Bhandari et al. |
| 6,491,978 | B1 | 12/2002 | Kalyanam |
| 6,593,484 | B2 | 7/2003 | Yasuhara et al. |
| 6,616,972 | B1* | 9/2003 | Senzaki et al. ............ 427/255.31 |
| 7,193,098 | B1 | 3/2007 | Lucey et al. |
| 7,348,445 | B2 | 3/2008 | Peters et al. |
| 2004/0009307 | A1* | 1/2004 | Koh et al. ..................... 427/569 |
| 2004/0014320 | A1 | 1/2004 | Chen et al. |
| 2004/0219784 | A1 | 11/2004 | Kang et al. |
| 2005/0042373 | A1* | 2/2005 | Kraus et al. ................. 427/248.1 |
| 2005/0202171 | A1* | 9/2005 | Shin ............................ 427/248.1 |
| 2006/0211246 | A1 | 9/2006 | Ishizaka et al. |
| 2006/0223312 | A1* | 10/2006 | Yonker et al. ................. 438/674 |
| 2007/0218683 | A1 | 9/2007 | Ishizaka et al. |
| 2008/0050916 | A1 | 2/2008 | Yonker et al. |
| 2008/0102205 | A1 | 5/2008 | Barry et al. |
| 2008/0213999 | A1 | 9/2008 | Wagner |
| 2008/0248648 | A1 | 10/2008 | Thompson et al. |
| 2009/0053905 | A1* | 2/2009 | Kim .............................. 438/785 |
| 2009/0115486 | A1 | 5/2009 | Na |
| 2012/0323008 | A1* | 12/2012 | Barry et al. ..................... 546/11 |

FOREIGN PATENT DOCUMENTS

| | | |
|---|---|---|
| JP | 2001 329367 | 11/2001 |
| JP | 2005 132756 | 5/2005 |
| JP | 2005 132757 | 5/2005 |
| JP | 2007 246513 | 9/2007 |
| WO | WO 02 20870 | 3/2002 |
| WO | WO 02 27063 | 4/2002 |

OTHER PUBLICATIONS

Leskela, Thin Solid Films, 409, 2002, p. 138.*
Ritala, M. et al., "Atomic Layer Deposition Handbook," Academic Press, New York (2002), pp. 103-159.
Written Opinion for related PCT/EP2009/059067, Sep. 11, 2009.
International Search Report for PCT/EP2009/059067, Sep. 11, 2009.
Ahn, H. et al. "High-resolution solid-state 13C NMR studies of chemisorbed organometallics. Chemisportive formation of cation-like and alkylidene organotantalum complexes on high surface area inorganic oxides." Journal of the American Chemical Society, 124(24), 7103-7110, 2002.
Blanquart, V.C. et al., "High-performance imido-amido precursors for the atomic layer deposition of $Ta_2O_5$," Journal of Organometallic Chemistry, 444 (1993), pp. 91-94.
Gibson, V.C. et al. "Alkoxide, phenoxide and hydrido-phenoxide compounds of tantalum bearing the pentamethylcyclopentadienyl ligand." Journal of Organometallic Chemistry, 444(1-2), 91-4, 1993.
Mayer, J.M. et al. "Hydrogen-transfer reactions which generate new imine, imido, and trimethylenemethane complexes of tantalum." Journal of the American Chemical Society, 105(9), 2651-60, 1983.
Mayer, J.M. et al. "Synthesis and reactivity of new polyhydride compounds of tantalum(V)." Journal of the American Chemical Society, 104(8), 2157-65, 1982.
Wood, C.D. et al. "Reaction of carbon monoxide with Ta(n5-C5Me5)Me4. Intramolecular reductive coupling of carbon monoxide via an 'n2-acetone' intermediate," Journal of the American Chemical Society, 101(18), 5421-2, 1979.
International Search Report and Written Opinion for related PCT/EP2007/061216, Jan. 15, 2008.
Air Liquide, "Atomic layer deposition of $Ta_2O_5$," poster, ALD 2014 Conference, Kyoto, Japan, Jun. 15-18, 2014, 1 page.
Chaneliere, C. et al., "Tantalum pentoxide ($Ta_2O_5$) thin films for advanced dielectric applications," Materials Science and Engineering, R22 (1998) 269-322.
Chang, Y.-H. et al., "Chemical vapor deposition of tantalum carbide and carbonitride thin films from $Me_3Ce=Ta(CH_2CMe_3)_3$ (E = CH, N)," Journal of Materials Chemistry, 2003, 13, 365-369.
Gibson, V.C. et al., "Pairwise ligand exchange reactions in tetrahedral and pseudo-tetrahedral transition metal complexes," Dalton Trans., 2003, 4457-4465.
Hausmann, D. M. et al., "Highly conformal atomic layer deposition to tantalum oxide using alkylamide precursors," Thin Solid Films 443 (2003) 1-4.
International Technology Roadmap for Semiconductors, "Executive summary," 2009, 95 pgs.
Leskela, M. et al., "Atomic layer deposition (ALD): from precursors to thin film structures," Thin Solid Films 409 (2002) 138-146.
Schuisky, M. et al., "Atomic layer CVD in the Bi-Ti-O system," Chem. Vap. Deposition 2000, 6, No. 3, 139-145.

* cited by examiner

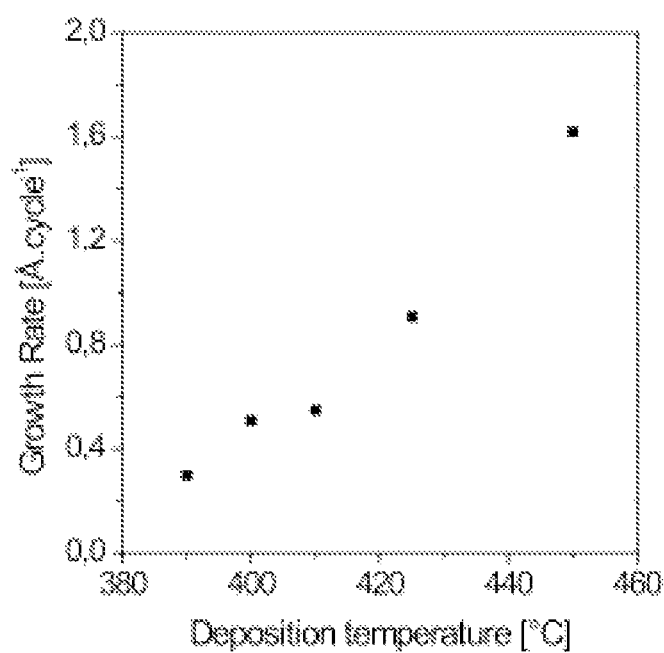

METHOD OF FORMING A TANTALUM-CONTAINING LAYER ON A SUBSTRATE

CROSS REFERENCE TO RELATED APPLICATIONS

This application is a 371 of International PCT Application PCT/EP2009/059067, filed Jul. 15, 2009, the entire contents of which are incorporated herein by reference. This application further claims foreign priority to EP 08305444.5 filed Aug. 1, 2008, the entire contents of which are incorporated herein by reference.

The invention relates to a method for forming a tantalum-containing layer on a substrate using an ALD (Atomic Layer Deposition) process.

The continuous shrink of the critical sizes in modern Integrated Circuit (IC) features associated with 3D topology architectures offers highest density at the expense of process complexity.

According to the International Technology Roadmap for Semiconductors (ITRS), physical techniques commonly used in the semiconductor industry for the deposition of thin films are no more suitable to meet the requirements in the future technology node, notably for high aspect ratio structures. Techniques like PVD (Physical Vapor Deposition), i-PVD (ionized-Physical Vapor Deposition) or PECVD (Plasma-Enhanced Chemical Vapor Deposition), employing high energy particles, induce high sticking coefficient which leads to poor step coverage, especially along the sidewalls.

The main industrial options to enable the deposition of highly uniform and conformal thin films with reasonable throughput in high aspect ratio structures are techniques such as MOCVD (Metal-Organic Chemical Vapor Deposition) or ALD (Atomic Layer Deposition).

However, films deposited by MOCVD need high thermal budget and generally follow a 3D-growth mechanism described by a Volmer-Weber model. Thin films grow by clusters nucleation and such technique also leads to insufficient step coverage.

The typical ALD process (e.g. as described in RITALA M., LESKELA M., Atomic Layer Deposition, Handbook of thin films materials) involves gaseous reactants led onto a substrate by pulses, separated by inert gas purging. In MOCVD, gaseous reactants are injected simultaneously and react by thermal self-decomposition while in ALD; the loss of the ligand is thermally induced by reaction with the surface groups on the substrate. In a temperature range, the surface reactions are self-limited, which allow the deposition of highly uniform and conformal films. Precursors must be volatile and stable enough to be easily transferred to the reaction chamber without being decomposed. Moreover, they must be reactive enough with the chemical groups of the surface to ensure reasonable growth rate.

ALD is of particular interest for the deposition of group V (V, Nb, Ta) metal containing films. Interest for conductive group V (V, Nb, Ta) metal containing thin films deposited by ALD has risen in the past few years for several main applications such as: copper diffusion barrier in BEOL applications, CMOS metal gate, High-k layers in memory devices or electrodes for Metal-Insulator-Metal applications (DRAM . . . ).

However, common group V (V, Nb, Ta) based metal-organic precursors are not suitable for the deposition of conductive group V (V, Nb, Ta) containing films without assisting the thermal ALD process by plasma techniques.

Halides such as $TaCl_5$ have been widely investigated such as disclosed in U.S. Pat. No. 6,268,288. However, some by-products generated during the deposition process, such as HCl or $Cl_2$, can cause surface/interface roughness that can be detrimental to the final properties. Moreover, Cl or F impurities can be detrimental to the final electrical properties. It is therefore expected to find new compounds having sufficient volatility but without containing Cl, F, or Br atoms.

Alkylamides and alkylimides, such as $Ta(NMe_2)_5$ (PDMAT), $Ta(=NtBu)(NEt_2)_3$ (TBTDET), $Ta(=NiPr)(NMe_2)_3$ (IPTDMT), $Ta(=NCH_2C(CH_3)_3)(NEt_2)_3$ (TAIMATA), $Ta(=NiPr)(NEt_2)_3$ (IPTDET) have been considered. Those precursors present the advantages of being frequently liquid at room temperature, like TBTDET, and having fair volatility, sufficient shelf-life and thermal stability. Urdahl & al, in WO02/20870, have also proposed TBTDET for the deposition of $Ta_2O_5$. TAIMATA has been disclosed in U.S. Pat. No. 6,593,484. A method for the deposition of tantalum nitride films by sequential injection of TBTDET or TAIMATA and other N source has been disclosed in US 2004/0219784. A method and apparatus of generating PDMAT precursor has been disclosed in US 2004/0014320.

In 2005, two Japanese patent applications JP 2005-132756 (A) and JP 2005-132757 disclosed the precursors mentioned above by introducing cyclopentadienyl based ligands, as described by the following general formulas:

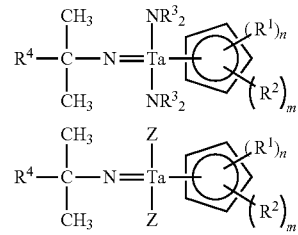

$R^1$ is an alkyl comprising 1 to 3 carbon atoms, and $R^2$ is an alkyl comprising 1 to 5 carbon atoms, $R^3$ is an alkyl comprising 1 to 6 carbon atoms, $R^4$ is methyl or ethyl, m is an integer of 0 to 5 and, as for n, m+n becomes five or less, Z is chlorine, bromine, or iodine. However, using such metal-organic precursors as described by MOCVD at 600° C., can not be suitable for the deposition of highly uniform and conformal thin films. Such deposition will result in a poor step coverage in high aspect ratio structures.

Nevertheless, according to the state of the art, MOCVD process is the best solution in terms of interesting growth rate, so others processes have never been implemented.

According to the present invention, surprisingly, it appears that in applying Atomic Layer Deposition techniques to a molecule which could have been first proposed for Chemical Vapor Deposition solves the inconvenience mentioned above. Moreover, using these precursors based chemistry by ALD allows to deposit thin films more conductive than those obtained from the conventional TBTDET.

According to a first embodiment, the invention relates to a method for forming a tantalum-containing layer on a substrate, the method comprising at least the steps of:

a) providing a vapor comprising at least one precursor compound of the formula $Cp(R^1)_m Ta(NR^2_2)_2(=NR^3)$ (I):

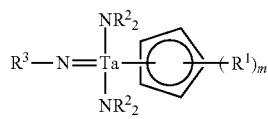

m < 5

Wherein:
$R^1$ is an organic ligand, each one independently selected in the group consisting of H, linear or branched hydrocarbyl radical comprising from 1 to 6 carbon atom;
$R^2$ is an organic ligand, each one independently selected in the group consisting of H, linear or branched hydrocarbyl radical comprising from 1 to 6 carbon atom;
$R^3$ is an organic ligand selected in the group consisting of H, linear or branched hydrocarbyl radical comprising from 1 to 6 carbon atom;
  b) reacting the vapor comprising the at least one compound of formula (I) with the substrate, according to an atomic layer deposition process, to form a layer of a tantalum-containing complex on at least one surface of said substrate. Alternatively, $R^1$ is an organic ligand, each one independently selected in the group consisting of H, linear or branched; alkyl, alkylsilyl, alkylamides, alkylsilylamides and/or alkoxides. $R^2$ may be chosen between an alkyl, alkylsilyl, alkylamides, alkylsilylamides and/or alkoxides. $R^3$ may be chosen between an alkyl, alkylsilyl, alkylamides, alkylsilylamides and/or alkoxides, preferably, $R^3$ is an alkyl with 3 or 4 carbon atoms such as isopropyl or tert-butyl.
In a specific configuration, each $R^1$ and $R^2$ is different from one another, which can have beneficial features on the compound physical properties.

The inventors found that, surprisingly, imido ligands, =NR, in an ALD process, can stabilize early transition metal in high-oxidation state by metal-nitrogen π-bonding and are playing a major role in the preservation of nitrogen atoms into the solid. They usually possess, as TBTDET or TAIMATA, very good thermal properties (good stability and volatility). The increase of the thermodynamic stability of the imido complexes compared to the amido ones allows depositing TaN thin films at higher temperatures and preventing a CVD like regime which destroys the self-limiting growth. So there is a synergy effect in using imido ligands, =NR, with an ALD process.

Furthermore, other embodiments of the invention are:
The method according to the invention further comprising the step:
  c) reaction of the complex formed obtained in step b) with a reagent selected from another metal source, reducing reactants and/or nitriding reactants and/or oxidizing reactants.
The method of the invention, wherein:
  $R^1$ is selected in the group consisting of H, an alkyl comprising from 1 to 4 carbon atom, preferably, $R^1$ is methyl or ethyl or isopropyl or tert-butyl;
  $R^2$ is an alkyl comprising from 1 to 3 carbon atom, more preferably, $R^2$ is an alkyl with 1 or 2 carbon atom; and
  $R^3$ is alkyl with 3 or 4 carbon atoms, more preferably, $R^3$ is isopropyl or tert-butyl.
The method wherein the vapour provided in step a) further comprises one or more metal (M')-organic precursor(s) to produce thin films containing tantalum and M'. M' being independently selected from any other element in the group II, III-A, Sulpher (S), transition metal, lanthanoids, or rare-earth metals.

The method of the invention, wherein m=0 in the formula (I).
The method, further comprising providing at least one reaction gas wherein the at least one reaction gas is selected from the group consisting of hydrogen, hydrogen sulfide, hydrogen selenide, hydrogen telluride, carbon monoxide, ammonia, organic amine, silane, disilane, higher silanes, silylamines, diborane, hydrazine, methylhydrazine, chlorosilane and chloropolysilane, metal alkyl, arsine, phosphine, trialkylboron, oxygen, ozone, water, hydrogen peroxide, nitrous oxide, nitrogen monoxide, nitrogen dioxide, alcohols, plasma comprising fragments of those species, and combinations thereof, preferably ozone or water.
The method, wherein the tantalum precursor of formula (I) is selected in the group consisting of:

(Cp)Ta(=NtBu)(NEt$_2$)$_2$;

(Cp)Ta(=NtBu)(NMe$_2$)$_2$;

(Cp)Ta(=NC$_5$H)(NMe$_2$)$_2$;

(Cp)Ta(=NtBu)(N(EtMe)$_2$)$_2$;

(Cp)Ta(=NiPr)(NEt$_2$)$_2$;

(Cp)Ta(=NiPr)(NMe$_2$)$_2$;

(MeCp)Ta(=NtBu)(NMe$_2$)$_2$;

(MeCp)Ta(=NiPr)(NMe$_2$)$_2$.

The method, wherein the temperature of the substrate is 25° C. to 450° C., preferably 380° C. to 425° C., and wherein the atomic layer deposition chamber containing the substrate has a pressure of 0.133 Pa to 133 kPa, preferably below 27 kPa.
The method, further comprising the step of purging excess vapor comprising the at least one compound of formula (I) from the substrate, with an inert gas selected from the group consisting of hydrogen, nitrogen, helium, argon, and mixtures thereof.
The method, wherein the tantalum-containing layer has a thickness of 0 μm to 10 μm.
A method of manufacturing a semiconductor structure, comprising the steps of the method defined in the present invention, wherein the substrate is a semiconductor substrate.
A New Technique to Deposit Tantalum Containing Films Using Metal-Organic Precursors Described by the Following General Formula Cp($R^1$)$_m$Ta (NR$_2^2$)$_2$(=NR$^3$) as material source.
The vaporization of the tantalum source is realized by introducing a carrier gas into a heated container containing the said metal source. The container is preferably heated at a temperature allowing to get the said metal source at a sufficient vapor pressure. The carrier gas can be selected from Ar, He, H$_2$, N$_2$ or mixtures of them. The said tantalum source can be mixed to a solvent or to another metal source or to a mixture of them in the container. The container can for instance be heated at temperatures in the range of 25° C.-300° C., preferably below 150° C. Those skilled in the art will consider that the temperature of the container can be adjusted to control the amount of precursor vaporized. To control the evaporation level in the container, the pressure in the container can be modified. By reducing the pressure in the container, the level of vaporation of the tantalum source can be increased. The pressure in the container can for instance be changed in the range of 0.133 Pa until 133 kPa, preferably below 27 kPa.

The said tantalum source can also be fed in liquid state to a vaporizer where it is vaporized. The said metal source can be mixed to a solvent. The said tantalum source can be mixed to another metal source. The said mixture of metal sources can be mixed to a solvent or a mixture of solvent. The said tantalum source can be mixed to a stabilizer. The said solvent can be selected in the group consisting of alcanes such as hexane, heptane, octane, aromatic solvents such as benzene, toluene, mesitylene, xylene, silicon containing solvent such as hexamethyldisiloxane, hexamethyldisilazane, tetramethylsilane, sulphur containing solvents such as dimethylsulfoxide, oxygen containing solvent such as tetrahydrofuran, dioxane.

The said vaporized tantalum source is then introduced into a reaction chamber where it is contacted to the surface of a substrate. The substrate can be heated to sufficient temperature to obtain the desired film at sufficient growth rate and with desired physical state and composition. Typical temperatures range from 150° C. to 600° C. Preferably the temperature is lower or equal to 450° C. The process can be assisted by a plasma technique. The use of plasma techniques allows ionizing the precursor vapor and/or the reactant used to form radicals and thus improve the reactivity of the said vaporized metal source and/or the reactivity of other gaseous species, used in the process.

The method of the present invention is a method assisted or not by plasma techniques, for depositing a tantalum containing film on the surface of a substrate comprising at least: exposition of the surface of a substrate to a tantalum precursor described by the following general formula $Cp(R^1)_m Ta(NR^2{}_2)_2(=NR^3)$ (I) and a reagent selected from reducing reactants, oxidizing reactants and/or nitriding reactants, to produce a tantalum containing thin film on the surface. Example of reagent can be selected in the list: $H_2$, $N_2H_2$, methylhydrazine, $NH_3$, $SiH_4$, $Si_2H_6$, $Si_3H_8$, TSA, $Si_2Cl_6$ or any chlorosilane or chloropolysilane, trimethylaluminium, $ZnEt_2$ or any metal alkyl, $BH_3$, $B_2H_6$, $PH_3$, $AsH_3$, trimethylboron, triethylboron, CO, monoamines, diamines, mixtures of them or plasma comprising fragment of those species. Example of oxidizing reagents can be selected in the list: $O_2$, $O_3$, $H_2O$, $H_2O_2$, NO, $NO_2$, $N_2O$, $CH_3OH$ or any alcohol, mixture of them or plasma comprising fragments of those species. Oxidizing species may alternatively be metal-organic compounds containing a metal-oxygen bond.

The deposition method, of this invention improves upon known methods by allowing the use of lower temperatures and producing higher quality films. Moreover, TaN ALD using TBTDET and $NH_3$ resulted in thin films with resistivity values from 1.1 to 1.4 Ohmcm in the 240° C.-280° C. temperature range, while with the precursors of the invention the film resistivity is less than 0.5 Ohmcm and thus, two to three times lower compared to the conventional TBTDET. Furthermore, the thermal stability is improved: TBTDET is decomposed at 270° C., while TBTDETCp is decomposed from 315° C. The ALD process will be provided with a higher temperature.

Another advantage is that the growth rate reaches a good level with the process of the invention: 0.6 Angstrom·cycle$^{-1}$.

In one embodiment, the method of the invention consists in introducing alternatively a tantalum-organic precursor described by the general formula (I) $Cp(R^1)_m Ta(NR^2{}_2)_2(=NR^3)$ into a reaction chamber with a reagent. In a temperature range which depends on the precursor thermal stability and physical properties, the said tantalum-organic precursor reacts in a self-limited manner with the chemical bonds present onto the surface of a substrate, chosen without limitation. Preferably, un-deposited tantalum-organic precursors molecules are removed from the reaction chamber. The reagent introduced, reacts also in a self-limited manner.

Once all the complexes present on the surface of the substrate have reacted with the reagent, species are removed from the reaction chamber by a purge gas. The purge gas can for instance be selected within $N_2$, Ar, He, $H_2$ mixtures of them. The purge gas may additionally contain other gas species that do not modify the chemical reactivity of the surface. Alternatively, the purge can be realized by vacuum. This process can be repeated as many times as necessary to reach the desired film thickness. The reagent is selected from reducing reactants, nitriding reactants, oxidizing reactants, or a mixture of them.

Example of reagent can be selected in the list: $H_2$, $N_2H_2$, methylhydrazine, $NH_3$, $SiH_4$, $Si_2H_6$, $Si_3H_8$, TSA, $Si_2Cl_6$ or any chlorosilane or chloropolysilane, trimethylaluminium, $ZnEt_2$ or any metal alkyl, $BH_3$, $B_2H_6$, $PH_3$, $AsH_3$, trimethylboron, triethylboron, CO, monoamines, diamines, mixtures of them or plasma comprising fragment of those species. Example of oxidizing reagents can be selected in the list: $O_2$, $O_3$, $H_2O$, $H_2O_2$, NO, $NO_2$, $N_2O$, $CH_3OH$ or any alcohol, mixture of them or plasma comprising fragments of those species, preferably plasma comprising $H_2$, $NH_3$ or $O_2$. Oxidizing species may alternatively be metal-organic compounds containing a metal-oxygen bond.

In one embodiment, the method of the invention consists in introducing alternatively first a tantalum-organic precursor described by the general formula (I) $Cp(R^1)_m Ta(NR^2{}_2)_2(=NR^3)$ into a reaction chamber and second a reagent or another metal source. This another metal source being independently selected from any other element in the group II, III-A, III-B, Sulpher (S), transition metal, lanthanoids, or rare-earth metals. In a temperature range which depends on the precursor thermal stability and physical properties, the said metal-organic precursors react in a self-limited manner with the chemical bonds present onto the surface of a substrate. Preferably, un-deposited metal-organic precursors molecules are removed from the reaction chamber. The reagent introduced, reacts also in a self-limited manner. Once all the complexes present on the surface of the substrate have reacted with the reagent, species are removed from the reaction chamber by a purge gas. The purge gas can for instance be selected within $N_2$, Ar, He, $H_2$ mixtures of them. The purge gas may additionally contain other gas species that do not modify the chemical reactivity of the surface.

Alternatively, the purge can be realized by vacuum. This process can be repeated as many times as necessary to reach the desired film thickness. The reagent is selected without limitation from reducing reactants, nitriding reactants, oxidizing reactants, or a mixture of them. Example of reagent can be selected in the list: $H_2$, $N_2H_2$, methylhydrazine, $NH_3$, $SiH_4$, $Si_2H_6$, $Si_3H_8$, TSA, $Si_2Cl_6$ or any chlorosilane or chloropolysilane, trimethylaluminium, $ZnEt_2$ or any metal alkyl, $BH_3$, $B_2H_6$, $PH_3$, $AsH_3$, trimethylboron, triethylboron, CO, monoamines, diamines, mixtures of them or plasma comprising fragment of those species. Example of oxidizing reagents can be selected in the list: $O_2$, $O_3$, $H_2O$, $H_2O_2$, NO, $NO_2$, $N_2O$, $CH_3OH$ or any alcohol, mixture of them or plasma comprising fragments of those species. Oxidizing species may alternatively be metal-organic compounds containing a metal-oxygen bond.

EXAMPLES

1. Tantalum-Organic Precursors

Examples of metal-organic precursors described by the general formula $Cp(R^1)_m M(NR^2{}_2)_2(=NR^3)$ which can be used in the present invention, include without limitation:

(Cp)Ta(=NtBu)(NEt$_2$)$_2$ (Cp)Ta(=NtBu)(NMe$_2$)$_2$ (Cp)Ta(=NC$_5$H$_{11}$)(NMe$_2$)$_2$ (Cp)Ta(=NtBu)(N(EtMe)$_2$)$_2$ (Cp)Ta(=NiPr)(NEt$_2$)$_2$ (Cp)Ta(=NiPr)(NMe$_2$)$_2$.

2. ALD Process Using TaCp(=NtBu)(NEt$_2$)$_2$ and Ammonia

TaCp(=NtBu)(NEt$_2$)$_2$ is stored into a container. The container is heated at 120° C. and N$_2$ is used as carrier gas at a flow of 50 sccm. Ammonia (NH$_3$) is used as nitrogen source. The substrate is heated at 400° C. The precursor is sequentially introduced into the reaction chamber with NH$_3$: during the first step a pulse of TaCp(=NtBu)(NEt$_2$)$_2$ is introduced during about 8 seconds, followed by a 13 seconds N$_2$ purge. A pulse of NH$_3$ is then introduced into the reaction chamber during 8 seconds, followed by a 13 seconds N$_2$ purge. The first step is then done again. 400 cycles are performed this way. A film of tantalum nitride is obtained.
The results obtained in terms of growth rate for thin films deposited by ALD, in the 390° C. -450° C. temperature range, from (Cp)Ta(=NtBu)(NEt$_2$)$_2$ and ammonia are shown in FIG. 1.
A step coverage of 100% is achieved for thin films deposited on substrates with 3D architectures. The bottoms such as the sidewalls are conformally and uniformly recovered.

Therefore, the method disclosed in the present invention allows to deposit tantalum carbo-nitride on structures with high aspect ratio, which was not possible with the same precursor by using conventional deposition technique.

3. ALD process using TaCp(=NtBu)(NEt$_2$)$_2$ and Ammonia Separated by an Trimethyl Aluminum (TMA) Pulse TaCp(=NtBu)(NEt$_2$)$_2$ is stored into a container. The container is heated at 120° C. and N$_2$ is used as carrier gas at a flow of 50 sccm. Ammonia (NH$_3$) is used as nitrogen source. The substrate is heated at 400° C. The precursor is sequentially introduced into the reaction chamber with trimethyl aluminium (TMA) and NH$_3$: during the first step a pulse of TaCp(=NtBu)(NEt$_2$)$_2$ is introduced during about 8 seconds, followed by a 13 seconds N$_2$ purge. A pulse of trimethyl aluminium (TMA) is then introduced into the reaction chamber during about 8 seconds, followed by a 13 seconds N$_2$ purge. A pulse of NH$_3$ is then introduced into the reaction chamber during 8 seconds, followed by a 13 seconds N$_2$ purge. The first step is then done again. 400 cycles are performed this way. A film of tantalum nitride is obtained.

4. ALD Process Using TaCp(=NtBu)(NEt$_2$)$_2$ Ozone

TaCp(=NtBu)(NEt$_2$)$_2$ is stored into a container. The container is heated at 120° C. and N$_2$ is used as carrier gas at a flow of 50 sccm. Ozone (O$_3$) is used as oxygen source. The substrate is heated at 400° C. The precursor is sequentially introduced into the reaction chamber with O$_3$: during the first step a pulse of TaCp(=NtBu)(NEt$_2$)$_2$ is introduced during about 8 seconds, followed by a 13 seconds N$_2$ purge. A pulse of O$_3$ is then introduced into the reaction chamber during 8 seconds, followed by a 13 seconds N$_2$ purge. The first step is then done again. 400 cycles are performed this way. A film of tantalum oxy-nitride is obtained.

It will be understood that many additional changes in the details, materials, steps and arrangement of parts, which have been herein described in order to explain the nature of the invention, may be made by those skilled in the art within the principle and scope of the invention as expressed in the appended claims. Thus, the present invention is not intended to be limited to the specific embodiments in the examples given above.

What is claimed is:

1. A method for forming a tantalum-containing layer on a substrate, the method comprising at least the steps of:
   a) providing a vapor comprising at least one precursor compound selected from the group consisting of (Cp)Ta(=NtBu)(NEt$_2$)$_2$ and (Cp)Ta(=NtBu)(NMe$_2$)$_2$;
   b) reacting the vapor comprising the at least one precursor compound with the substrate, in an atomic layer deposition process, to form a layer of a tantalum-containing complex on at least one surface of said substrate, wherein the temperature of the substrate is 315° C. to 390° C.;
   c) reacting the tantalum-containing complex obtained in step b) with ozone.

2. The method of claim 1, wherein the vapor provided in step a) further comprises one or more metal (M')-organic precursor(s) to produce thin films containing tantalum and M'.

3. The method of claim 1, wherein the precursor compound is (Cp)Ta(=NtBu)(NEt$_2$)$_2$.

4. The method of claim 3, wherein the atomic layer deposition process comprises a process pressure of 0.133 Pa to 133 kPa.

5. The method of claim 3, wherein the atomic layer deposition process comprises a process pressure below 27 kPa.

6. The method of claim 1, further comprising the step of purging excess vapor comprising the at least one precursor compound from the substrate with an inert gas selected from the group consisting of hydrogen, nitrogen, helium, argon, and mixtures thereof.

7. A method of manufacturing a semiconductor structure, comprising the steps of the method of claim 1, wherein the substrate is a semiconductor substrate.

8. The method of claim 1, wherein the precursor compound is (Cp)Ta(=NtBu)(NMe$_2$)$_2$.

9. The method of claim 3, wherein the atomic layer deposition process does not utilize plasma.

10. The method of claim 8, wherein the atomic layer deposition process does not utilize plasma.

11. A method for forming a tantalum-containing layer on a substrate, the method comprising at least the steps of:
   a) reacting a vapor of a precursor compound selected from the group consisting of (Cp)Ta(=NtBu)(NEt$_2$)$_2$ and (Cp)Ta(=NtBu)(NMe$_2$)$_2$ with the substrate, in an atomic layer deposition process, to form a layer of a tantalum-containing complex on at least one surface of said substrate, wherein the temperature of the substrate is 315° C. to 390° C.;
   b) reacting the tantalum-containing complex obtained in step b) with ozone, wherein the atomic layer deposition process does not utilize plasma.

12. The method of claim 11, wherein the vapor provided in step a) further comprises one or more metal (M')-organic precursor(s) to produce thin films containing tantalum and M'.

13. The method of claim 11, wherein the precursor compound is (Cp)Ta(=NtBu)(NEt$_2$)$_2$.

14. The method of claim 11, wherein the precursor compound is (Cp)Ta(=NtBu)(NMe$_2$)$_2$.

15. The method of claim 11, wherein the atomic layer deposition process comprises a process pressure of 0.133 Pa to 133 kPa.

16. The method of claim 11, further comprising the step of purging excess vapor of the precursor compound from the substrate with an inert gas selected from the group consisting of hydrogen, nitrogen, helium, argon, and mixtures thereof.

\* \* \* \* \*